(12) United States Patent
Cheng

(10) Patent No.: US 6,800,906 B2
(45) Date of Patent: Oct. 5, 2004

(54) ELECTROSTATIC DISCHARGE PROTECTION CIRCUIT

(75) Inventor: Jyh-Nan Cheng, Llan (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 10/065,455

(22) Filed: Oct. 18, 2002

(65) Prior Publication Data

US 2004/0075136 A1 Apr. 22, 2004

(51) Int. Cl.[7] .................................. H02L 23/62
(52) U.S. Cl. .................. 257/355; 257/356; 257/362
(58) Field of Search .................. 257/355–363

(56) References Cited

U.S. PATENT DOCUMENTS

| | | | | |
|---|---|---|---|---|
| 4,757,363 A | * | 7/1988 | Bohm et al. ............... 257/358 |
| 4,937,639 A | * | 6/1990 | Yao et al. ................... 257/360 |
| 5,181,091 A | * | 1/1993 | Harrington et al. ......... 257/355 |
| 5,481,129 A | * | 1/1996 | DeJong et al. .............. 257/360 |
| 5,652,455 A | * | 7/1997 | Zambrano ................... 257/360 |
| 5,708,289 A | * | 1/1998 | Blanchard ................... 257/355 |
| 5,777,367 A | * | 7/1998 | Zambrano ................... 257/355 |

* cited by examiner

*Primary Examiner*—Ori Nadav
(74) *Attorney, Agent, or Firm*—J.C. Patents

(57) ABSTRACT

The invention provides an ESD protection circuit compatible with the high voltage device manufacturing processes by using parasitic bipolar junction transistor punch characteristics. The design of the present invention takes advantage of bipolar punch characteristics of the parasitic NPN or PNP bipolar structure to bypass the ESD current, thus significantly increasing the ESD level. In addition, the ESD protection circuit of the present invention can greatly reduce the ESD cell areas by eliminating certain prior art diode structure.

6 Claims, 3 Drawing Sheets

ELECTROSTATIC DISCHARGE PROTECTION CIRCUIT

BACKGROUND OF INVENTION

1. Field of Invention

The present invention relates to a protection circuit. More particularly, the present invention relates to an electrostatic discharge protection circuit applied in high voltage device manufacturing processes.

2. Description of Related Art

Semiconductor manufacturers and electronic device users continue to demand faster, increasingly complex devices in smaller packages at lower costs. In order to meet those demands, semiconductor manufacturers keeps shrinking geometries of the devices. As the devices turn compact and clearances and line widths approach theoretical limits, devices are becoming increasingly susceptible to damage by electrostatic discharge (ESD). Short, fast, high-amplitude ESD pulses are an inevitable part of the day-to-day environment of both chips and equipment. In fact, ESD is the leading cause of device failure in the field. The destructive mechanism associated with ESD in devices is primarily melting of the device material due to high temperatures. Due to the nature of ESD, it must be assumed that all devices will encounter an event during the normal course of their lifetime. Hence, ensuring that devices provide a reasonable and acceptable level of tolerance to ESD is an important part of all device design and manufacturing programs.

To determine the ESD threshold of a device, it is necessary to agree on the type of ESD stress for which testing will take place. There are presently three major ESD stress types: Human Body Model (HBM), Machine Model (MM) and Charged Device Model (CDM). For HBM, the threshold voltage can be as high as 2 KV, while the threshold voltage for MM is around 200V.

FIG. 1A is a circuit diagram of the conventional diode protection circuit. From FIG. 1A, three terminals, including Vcc terminal 1, input/output (I/O) terminal 2 and Vss terminal 3 can be used to measure (or test) the voltage. Normally, the conventional diode protection circuit consists of two n-diodes and one p-diode. FIG. 1B is a schematic cross sectional view of the conventional diode protection circuit containing two n-diodes and one p-diode, applied in the high voltage (HV) manufacture processes. A provided P-type substrate (P substrate) 100 contains three separate wells, including a high voltage (HV) N-well 102 formed between two HV P-wells 104, 106. In the HV N-well 102, a P– region 110 is separate from and between two N+ regions 114, 116 near both sides of the HV N-well 102. A P+ region 112 is formed in the HV N-well 102 and encompassed by the P– region 110. Switching into different dopant types forms similar sub-regions in HV P-wells. The HV P-well 104 includes an N– region 120, a N+ region 122 encircled within the N– region, two separate P+ regions 124, 126 near both sides of the HV P-well 104. The N– region 120 is separate from and between two separate P+ regions 124, 126. Also, the HV P-well 106 includes an N– region 130, a N+ region 132 encircled within the N– region, two separate P+ regions 134, 136 near both sides of the HV P-well 106. The N– region 130 is separate from and between two separate P+ regions 134, 136. The N+ regions 114, 122 are coupled to the Vcc terminal 1, while the P+ regions 126, 134 are coupled to the Vs terminal 3. The P+ region 112 and the N+ region 132 are coupled to the I/O terminal 2.

In this case, the conventional diode protection circuit, containing two n-diodes and one p-diode applied in the high voltage (HV) manufacture processes, has a rather high breakdown voltage, thus providing very little protection for high voltage devices. Furthermore, the conventional diode protection circuit depends on the p-diode between the Vcc terminal 1 and I/O terminal 2 for bypassing large ESD current, which can easily damage junction damage or cause contact spiking.

SUMMARY OF THE INVENTION

The invention provides an ESD protection circuit compatible with the high voltage device manufacturing processes by using parasitic bipolar junction transistor (BJT) punch characteristics. The design of the present invention takes advantage of bipolar punch characteristics of the parasitic NPN or PNP bipolar structure to bypass the ESD current, thus significantly increasing the ESD level. In addition, the ESD protection circuit of the present invention can greatly reduce the ESD cell areas by eliminating certain prior art diode structure.

As embodied and broadly described herein, the invention provides an electrostatic discharge (ESD) protection circuit, comprising: an N substrate having four separate wells, including a high voltage (HV) N-well between a first HV P-well and a second HV P-well and a third HV P-well, the first HV P-well comprising a first P+ region and the second HV P-well comprising a second P+ region, the HV N-well further comprising: a first N– region and a first N+ region disposed within and encompassed by the first N– region, and the third HV P-well further comprising: a third and a fourth P+ regions near both sides of the HV P-well; a second N– region separate from and between the third and fourth P+ regions; and a second N+ region disposed within and encompassed by the second N– region.

As embodied and broadly described herein, the invention provides an ESD protection circuit, comprising: a P substrate having four separate wells, including a first HV N-well arranged between a first HV P-well and a second HV P-well and a second HV N-well, the first HV P-well comprising a first P+ region and the second HV P-well comprising a second P+ region, the first HV N-well further comprising: a first N– region and a first N+ region disposed within and encompassed by the first N– region, and the second HV N-well further comprising: a second and a third N+ regions near both sides of the HV N-well; a first P– region separate from and between the second and third N+ regions; and a third P+ region disposed within and encompassed by the first P– region.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
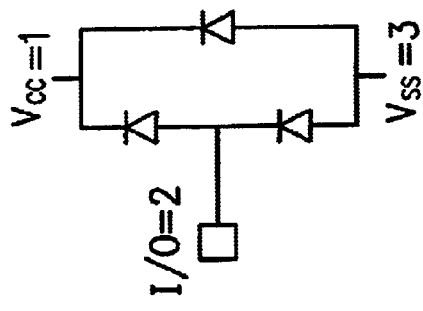
FIG. 1A is a circuit diagram of the conventional diode protection circuit.
Figure 1B:
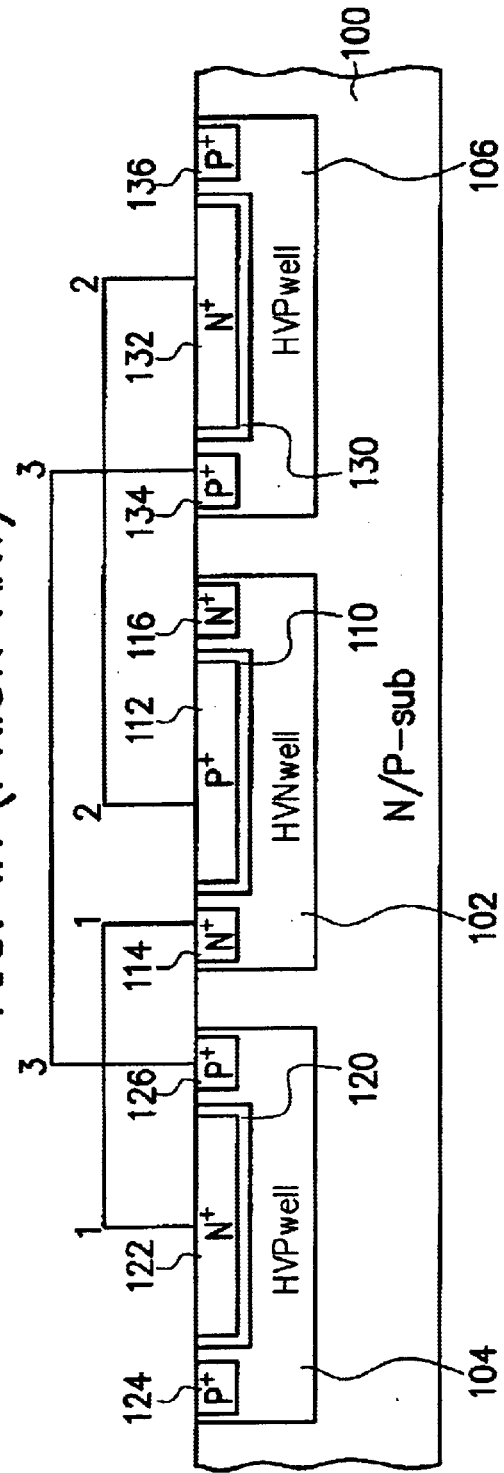
FIG. 1B is a schematic cross-sectional view of the conventional diode protection circuit.
Figure 2A:
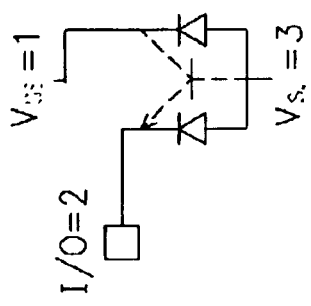
FIG. 2A is a circuit diagram of an ESD protection circuit according to one preferred embodiment of the present invention.
Figure 2B:
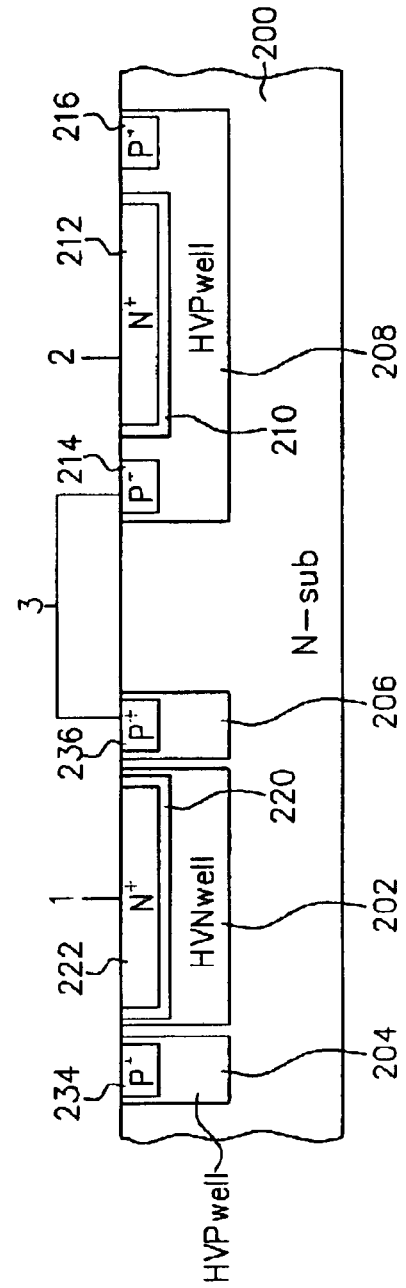
FIG. 2B is a schematic cross-sectional view of the ESD protection circuit according to one preferred embodiment of the present invention.

FIG. 2A is a circuit diagram of an ESD protection circuit according to one preferred embodiment of the present invention. From FIG. 2A, three terminals, including Vcc terminal 1, input/output (I/O) terminal 2 and Vss terminal 3 can be used to measure the breakdown voltage. FIG. 2B is a schematic cross-sectional view of the ESD protection circuit according to one preferred embodiment of the present invention, applied in the high voltage (HV) manufacture processes. A provided N-type substrate (N substrate) 200 contains four separate wells, including a high voltage (HV) N-well 202 arranged between a first and a second HV P-wells 204, 206 and a third HV P-well 208. The third HV P-well 208 exists apart in the substrate 200 and is separate from the other three wells. In the third HV P-well 208, an N– region 210 is separate from and between two P+ regions 214, 216 near both sides of the HV P-well 208. A N+ region 212 is formed within and encompassed by the N– region 210, in the HV P-well 208. A spacing, for example, 0.5–5 microns, exists between the N– region 210 and the N+ region 212. A first and a second P+ regions 234, 236 are formed within the first and second HV P-wells 204, 206 respectively. An N– region 220 as well as a N+ region 222 encompassed by the N– region 220 are included in the HV N-well 202. The HV N-well 202 is separate from and between two separate HV P-wells 204, 206.

An example of detailed conditions for high voltage manufacture processes of a 40V high voltage device is summarized in Table 1. These exemplary conditions are applied to the aforementioned structure.

| | | 40 V (N substrate) | | |
|---|---|---|---|---|
| | | Dosage | | |
| Layer | Type | Concentration | Energy | Junction depth |
| N+ region | As | 4.50E+15 | 80 KeV | 0.25 µm |
| P+ region | BF2 | 2.50E+15 | 55 KeV | 0.25 µm |
| N– region | P | 5.00E+13 | 160 KeV | 1 µm |
| P– region | B | 5.00E+13 | 70 KeV | 1 µm |
| HV N-well | P | 1E12~6E12 | 300~400 KeV | 5 µm |
| HV P-well | B | 2E12~8E12 | 180~220 KeV | 5 µm. |

The N+ region 222 is coupled to Vcc terminal 1, while the N+ region 212 is coupled to I/O terminal 2. The P+ regions 214, 236 are coupled to Vss terminal 3. Between Vcc terminal 1 and I/O terminal 2, a parasitic NPN transistor is obtained as shown in FIG. 2A. The N+ region 212 with the N– region 210, the third HV P-well 208 plus the P+ regions 144, 216, 236, and the N substrate 200 in connected with HV N-well 202, N– region 220 and N+ region 222, can be considered as a (vertical) parasitic NPN bipolar transistor. For high voltage manufacture processes for a 40V high voltage device, such structure (parasitic NPN bipolar transistor) has a breakdown (punch) voltage about 48V.

Instead of using p-diode as the prior art, the design of the present invention takes advantage of bipolar punch characteristics of the parasitic NPN bipolar structure to bypass the ESD current, thus significantly increasing the ESD level. In addition, the ESD cell areas can be greatly reduced by eliminating the prior art p-diode structure of the ESD protection circuit.

Figure 3A:
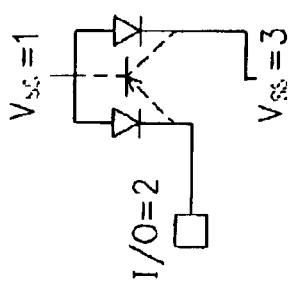
FIG. 3A is a circuit diagram of an ESD protection circuit according to another preferred embodiment of the present invention.
Figure 3B:
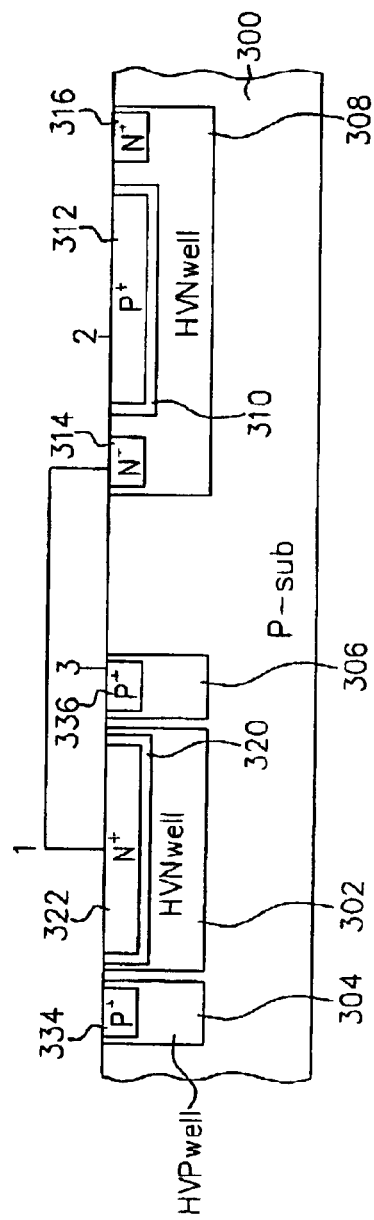
FIG. 3B is a schematic cross-sectional view of the ESD protection circuit according to another preferred embodiment of the present invention.

For a P substrate, the corresponding structure of the parasitic NPN transistor is the PNP bipolar transistor, which is obtained by interchanging N-type dopants for P-type dopants (i.e. N for P) and P for N in FIGS. 2A–2B. FIG. 3A is a circuit diagram of an ESD protection circuit according to another preferred embodiment of the present invention, including Vcc terminal 1, input/output (I/O) terminal 2 and Vss terminal 3. FIG. 3B is a schematic cross-sectional view of the ESD protection circuit according to another preferred embodiment of the present invention, applied in the high voltage manufacture processes. A provided P substrate 300 contains four separate wells, including a first high voltage (HV) N-well 302 arranged between a first and a second HV P-wells 304, 306 and a second HV N-well 308. The second HV N-well 308 exists apart in the substrate 300 and is separate from the other three wells. In the HV N-well 308, a P– region 310 is separate from and between two N+ regions 314, 316 near both sides of the HV N-well 308. A P+ region 312 is formed within and encompassed by the P– region 310, in the HV N-well 308. A spacing, for example, 1–5 microns, exists between the P– region 310 and the P+ region 312. Preferably, the spacing is about 2–3 microns. A first and a second P+ regions 334, 336 are formed within the first and second HV P-wells 304, 306 respectively. An N– region 320 as well as an N+ region 322 encompassed by the N– region 320 are included in the first HV N-well 302. The HV N-well 302 is separate from and between two separate HV P-wells 204, 206.

The P+ region 336 is coupled to Vss terminal 3, while the P+ region 312 is coupled to I/O terminal 2. The N+ regions 314, 322 are coupled to Vcc terminal 1. Between Vss terminal 3 and I/O terminal 2, a parasitic PNP transistor is obtained as shown in FIG. 3A. The P+ region 312 with the P– region 310, the HV N-well 308 plus N+ regions 314,316, 322, N– region 320 and HV N-well 302, together with the P substrate 300, HV P-well 306 and P+ region 336, can be considered as a (vertical) parasitic PNP bipolar transistor. For high voltage manufacture processes for a 40V high voltage device with comparable conditions shown in Table 1, such structure (parasitic PNP bipolar transistor) has a breakdown (punch) voltage about 48V.

Therefore, such design of the ESD protection circuit can provide proper ESD protection level for high voltage devices without causing junction damage and contact spiking.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit, comprising: an N substrate having four separate wells, including a high voltage (HV) N-well arranged between a first HV P-well, and a second HV P-well, and a third HV P-well, wherein the first HV P-well comprises a first P+ region and the second HV P-well comprises a second P+ region, wherein the third HV P-well exists apart in the N substrate and is separate from the other three wells, the HV N-well further comprising: a first N− region and a first N+ region disposed within and encompassed by the first N− region, and the third HV P-well further comprising: a third and a fourth P+ regions near both sides of the HV P-well; a second N− region separate from and between the third and fourth P+ regions; and a second N+ region disposed within and encompassed by the second N− region.

2. The ESD protection circuit of claim 1, wherein a spacing exists between the second N− region and the second N+ region.

3. The ESD protection circuit of claim 2, wherein the spacing is about 0.5 microns to about 5 microns.

4. An electrostatic discharge (ESD) protection circuit, comprising: a P substrate having four separate wells, including a first high voltage (HV) N-well arranged between a first HV P-well and a second HV P-well, and a second HV N-well, wherein the first HV P-well comprises a first P+ region and the second HV P-well comprises a second P+ region, wherein the second HV N-well exists apart in the P substrate and is separate from the other three wells, the first HV N-well further comprising: a first N− region and a first N+ region disposed within and encompassed by the first N− region, and the second HV N-well further comprising: a second and a third N+ regions near both sides of the HV N-well; a first P− region separate from and between the second and third N+ regions; and a third P+ region disposed within and encompassed by the first P− region.

5. The ESD protection circuit of claim 4, wherein a spacing exists between the first P− region and the third P+ region.

6. The ESD protection circuit of claim 5, wherein the spacing is about 0.5 microns to about 5 microns.

* * * * *